United States Patent [19]

Kawakita et al.

[11] Patent Number: 4,685,198
[45] Date of Patent: Aug. 11, 1987

[54] METHOD OF MANUFACTURING ISOLATED SEMICONDUCTOR DEVICES

[75] Inventors: Kenji Kawakita, Hirakata; Noboru Nomura, Kyoto; Toyoki Takemoto, Yawata, all of Japan

[73] Assignee: Matsushita Electric Industrial Co., Ltd., Osaka, Japan

[21] Appl. No.: 758,962

[22] Filed: Jul. 25, 1985

[51] Int. Cl.$^4$ ............................................. H01L 29/06
[52] U.S. Cl. .............................. 437/73; 148/DIG. 50; 148/DIG. 115; 156/647; 156/644; 357/49
[58] Field of Search ............................ 29/576 W, 580; 148/DIG. 50, DIG. 115; 156/647, 649, 651, 644; 357/49

[56] References Cited

U.S. PATENT DOCUMENTS

| 4,104,090 | 8/1978 | Pogge . |  |
|---|---|---|---|
| 4,437,226 | 3/1984 | Soclof | 29/580 |
| 4,485,551 | 12/1984 | Soclof | 156/647 |
| 4,520,552 | 6/1985 | Arnould et al. | 156/644 |

FOREIGN PATENT DOCUMENTS

| 56-12749 | 2/1981 | Japan | 29/576 W |
| 59-8346 | 1/1984 | Japan . | |

OTHER PUBLICATIONS

Nicholas et al, "Dielectric Isolation by Orientation-Dependent Etching", *Electronic Letters*, 20(24), 11/22/84.

*Primary Examiner*—Brian E. Hearn
*Assistant Examiner*—T. N. Quach
*Attorney, Agent, or Firm*—Wenderoth, Lind & Ponack

[57] ABSTRACT

Disclosed is a method of isolating a transistor perfectly by employing a selective oxidation technology (LOCOS technology). More particularly, vertical openings are formed in the surface of {100} silicon substrate, and oxidation resistant films are formed of this surface and in part of the side walls of these openings. In succession, by etching with an etchant having an orientation anisotropy, dents are formed at high precision in the side walls of the openings. By oxidizing using the oxidation resistant film as the mask, an oxide film growing out from a dent in the opening side wall is connected with another oxide film growing out from an adjacent dent. The transistor thus formed in the active region of the silicon electrically isolated from the substrate is small in parasitic capacitance and may be formed into a small size, so that it possesses the features suited to VLSI, that is, high speed, low power consumption, and processability to high density integration.

6 Claims, 30 Drawing Figures

METHOD OF MANUFACTURING ISOLATED SEMICONDUCTOR DEVICES

BACKGROUND OF THE INVENTION

Semiconductor integrated circuits are becoming higher in density, higher in speed, and lower in power consumption, and what matters particularly in these devices is parasitic capacitance. For example, in a bipolar device, it is parasitic capacitance that is generated between collector and substrate, or in a MOS device, it is parasitic capacitance that is generated between source, drain and substrate. When this parasitic capacitance can be reduced, it is possible to compose a semiconductor device of higher speed and lower power consumption. Accordingly, as method of reducing this capacitance, many attempts have been made so far. Among others, there is an attempt of perfect isolation to replace parts immediately beneath and at sides of semiconductor device by insulators, and several prior arts relating to this attempt are described below.

In the U.S. Pat. No. 4,104,090, an anodically processed porous silicon is used to form an insulator layer immediately beneath the semiconductor region. In the first place, as the substrate, a P type silicon wafer having P+-layer on the surface is used. Then P- or N-layer is formed on this P+-layer by epitaxial growth. The surface of the silicon wafer is oxidized, and a proper opening is formed by photolithography. This opening is etched by reactive ion etching or other process to form a groove to reach said P+-layer. To make this entire P+-layer porous, the P+-layer is selectively etched by the anodic process. The porous silicon is heated in oxygen and water ambient to become silicon dioxide completely. Finally the groove is filled with silicon dioxide or the like, and the P- or N-region separated by the insulator from the substrate and its surrounding is formed.

In the Japanese Laid-Open Patent No. 56-12749, a method of perfect insulation separation employing the conventional LOCOS technology is disclosed. First, a silicon nitride film is formed on a surface of silicon substrate, and a proper opening is formed by photolithography. In succession, using the patterned silicon nitride film as a mask, a sharp groove is formed in the silicon substrate. When the silicon nitride film is deposited on the silicon substrate surface and etched by sputtering, since the etching is excellent in linearity, only the silicon nitride film on the silicon substrate surface and groove bottom is etched, while the silicon nitride film is left on the side wall of the groove. Afterward, when thermally oxidizing for a proper time, the oxide film formed on the groove bottom reaches further to the lower part of the monocrystalline silicon region, and is finally joined with the oxide film propagating from the adjoining groove bottom. Thus, the monocrystalline silicon is completely isolated from the substrate.

The Japanese Laid-Open Patent No. 59-8346 refers to an improved version of perfect isolation technique of the preceding Japanese patent. More particularly, a band-like groove to reach the N+- region is formed in the silicon substrate possessing an N+buried region. Then, through this groove, the N+-region is selectively etched, and the distance between adjacent grooves is properly determined. The N+-region between the grooves is heated and oxidized until wholly turning into an oxide film, and it is completley isolated from the substrate.

As other method, for example, K. H. Nicholas et al. reported a process of using an orientation dependent etching in ELECTRONICS LETTER, Vol. 20, No. 24, 1985, pp. 1014–1015. In this method, first a silicon nitride film is deposited on a silicon (100) wafer, and a pattern is formed by photoetching. Next, using the nitride film as a mask, grooves are formed in the silicon substrate by reactive ion etching or other process. Furthermore, orientation-dependent etching is effected by ethylene diamine, and the distance between adjoining grooves is set to a proper size. Finally, the remaining narrow silicon-region between the adjoining grooves is heated and oxidized to be transformed into an oxide film so that the top silicon region is completely isolated from the substrate.

SUMMARY OF THE INVENTION

It is hence a primary object of this invention to present a method of manufacturing perfectly isolated, high-performance semiconductor devices.

This and other objects are accomplished by a method of manufacturing semiconductor devices, which comprises a process of forming a plurality of first openings in the surface of a semiconductor substrate, a process of forming an oxidation resistant film on the surface of the semiconductor substrate and in part of the side of the first openings to be connected thereto, a process of etching the semiconductor substrate exposed to the first openings by orientation-dependent process to form second openings, a process of forming an oxide film in the second openings using said oxidation resistant film as a mask, and a process of burying insulators into the first openings.

In a specific embodiment, the crystal plane orientation of the semiconductor substrate is {100}. The first openings are formed vertically to the surface of the semiconductor substrate. The oxide films buried into the adjoining second openings are connected with each other, and the second openings are formed by etching, using an etchant with the fastest etching speed on the plane with {100} orientation of the semiconductor substrate. As the etchant, potassium hydroxide, mixed solution of ethylenediamine and pyrocatechol, mixed solution of hydrazine and pyrocatechol, or their aqueous solution or mixed solution may be used. Furthermore, this invention may include a process of forming plural second openings differing in size. Besides, after the process of forming an oxidation resistant film, a process of forming an etching resistance film in the bottom of the first openings may be provided.

Moreover, this invention relates to a method of manufacturing semiconductor devices, which comprises a process of forming a plurality of first openings in the surface of a semiconductor substrate, a process of forming an oxidation resistant film on the surface of the semiconductor substrate and in part of the side of the first openings to be connected thereto, a process of forming an etching resistant film in the bottom of the first openings, a process of etching the semiconductor substrate exposed to the first opening side by orientation-dependent process to form second openings, a process of forming an oxide film in the second openings by using said oxidation resistant film as the mask, and a process of burying insulators into the first openings.

This invention has various advantages, among which are as folows.

(1) In the method of this invention, since orientation-dependent etching is employed in the process to form second openings of the semiconductor device, the precision of etching is excellent, and the thickness of the oxide film to be formed in the second openings may be kept to a minimum required limit.

(2) As a result, introduction of strains into crystals at the time of oxidation is controlled, and the reduction of active region due to invasion of oxide film is lessened.

(3) Besides, active regions differing in size can be obtained, since it is possible to form plural second openings differing in size.

(4) By forming an etching resistant film in the bottom of the first openings before forming second openings by orientation-dependent etching, the unnecessary etching of the first opening bottom may be prevented at the time of subsequent orientation-dependent etching, so that the surface may be flattened easily.

While the novel features of the invention are set forth with particularity in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 1 (a) to 1(e) are sectional views showing method of manufacturing a semiconductor device invented by us before reaching the present invention;

FIGS. 2 (a) to 2(j) are sectional views showing a first embodiment of this invention;

FIGS. 3 (a) to 3(e) are sectional views showing a second embodiment of this invention; and FIGS. 4 (a) to (j) are sectional views showing a third embodiment of this invention.

DETAILED DESCRIPTION OF THE INVENTION

FIG. 1 is intended to illustrate the technology invented by us before reaching the present invention, as disclosed in the Japanese Laid-Open Patent No. 56-12749. To facilitate the understanding of the present invention, this technology is first described below. In FIG. 1 (a), numeral 10 is a silicon substrate, and 12 denotes a selectively opened oxidation resistant substance, for example, silicon nitride film. In FIG. 1 (b), using the silicon nitride film 12 as the mask, the silicon substrate 10 is anisotropically etched, for example, by reactive ion etching, to be opened nearly vertically, and openings 14 are formed. In FIG. 1 (c), a silicon nitride film 16 is formed on the entire surface. In FIG. 1 (d), the silicon nitride film 16 is removed by anisotropic etching, while the silicon nitride film 16 depositing on the side wall is not removed because it has been formed by anisotropic etching. In this state, the silicon substrate 10 is exposed to the bottom of the openings 14. Then, using these silicon nitride films 12, 16 as the mask, oxidation is effected to form an oxide film as shown in FIG. 1 (e). Meanwhile, as the optimum condition, when the distance of the active regions is narrowed, the oxide films 18 extended laterally will be mutually connected beneath the active region 20.

Figure 1A:
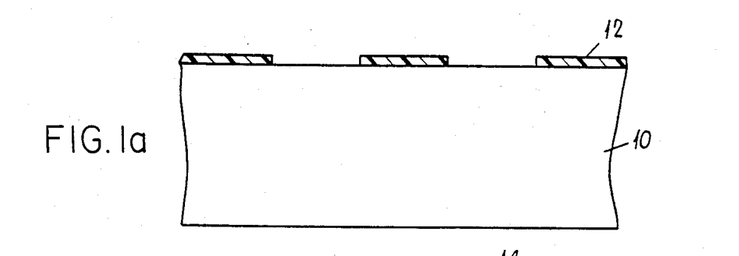
Figure 1B:
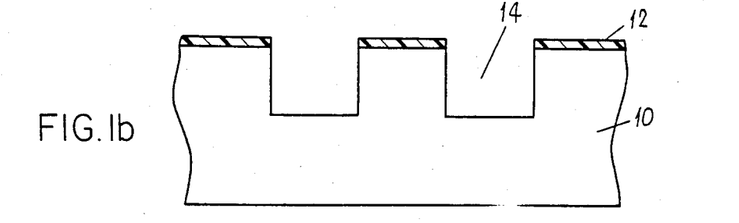
Figure 1C:
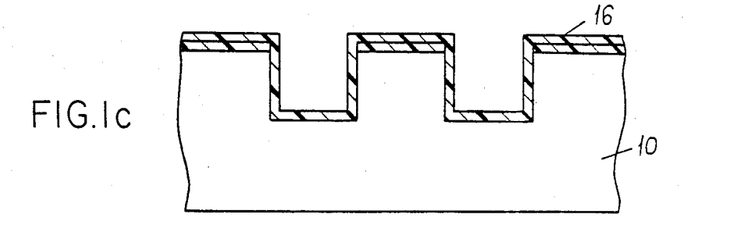
Figure 1D:
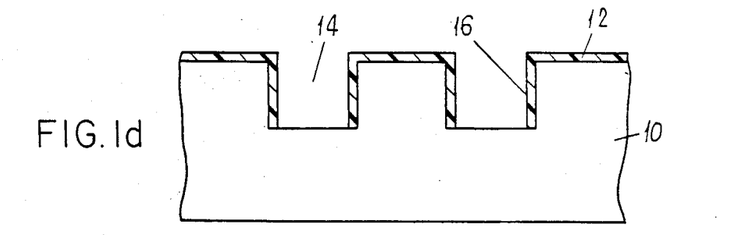
Figure 1E:
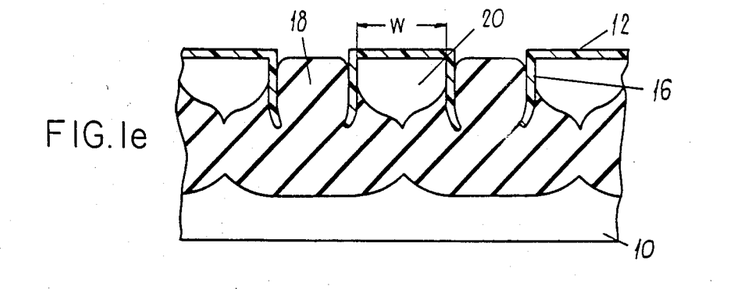

In this example, oxide films for separation can be formed at the sides and bottom of the active region, and it is effective to reduce the parasitic capacitance, but it was found to have the following problems as a result of researches.

(1) There is a limitation to the width W of the active region that can be isolated as shown in FIG. 1 (e). That is, a region of large width W and one of small width W' coexist on one substrate, the oxide films may not be joined at the bottom of the active region with large W after thermal oxidation. In an ordinary LSI, the fan-out of the peripheral transistors is greater than that inside the chip, and it is generally practiced to enhance the mutual conductance of the peripheral transistors by widening the gate width W.

(2) If it is attempted to oxidize sufficiently in the lateral direction in the lower part of the active region, the oxidation in the upward direction is similarly advanced, and the area of the active region is reduced.

This invention is intended to solve above-discussed technical problems. That is, this invention is to alleviate the limitation of the width of active region that can be isolated on a wafer, and to control the penetration of oxide film into the lower part of the active region at high precision so as to realize a semiconductor element suited to fine processing.

Several embodiments of this invention are described below.

[Embodiment 1]

FIG. 2 is a process sectional drawing showing a first embodiment of this invention. In FIG. 2 (a), numeral 22 is a silicon substrate with crystal plane orientation of 100. In this substrate, a thermal oxidation film 24 is formed in a thickness of 500 Å to 2000 Å, and a silicon nitride film 26 is deposited thereon in a thickness of about 1000 to 3000 Å by low pressure CVD method. Using a photoresist 27 which has been pattern-transferred by a known photolithographic method as the mask, the silicon nitride film 26 and pad oxide film 24 are etched. For this etching, it is preferable to employ a reactive ion etching (RIE) with a strong anisotropic property, but plasma etching or wet etching may be employed although the precision of pattern transfer is slightly inferior. In succession, as shown in FIG. 2 (b), the parts to become isolated regions of the substrate are selectively etched to form openings 28. The etching method is the same RIE with strong anisotropy, and the openings 28 are etched vertically. Then, after forming a thermal oxidation film 30 over the entire surface, the oxidation resistant film, such as silicon nitride film 32 is deposited by low pressure CVD. See FIG. 2 (c). Since the low pressure CVD process is excellent in coating performance, a homogeneous silicon nitride film 32 is formed on the side wall of the openings 28. Next, as shown in FIG. 2 (d), by the strongly anisotropic RIE, the nitride film is etched, while only the nitride film 32 on the side wall of the openings 28 are left over. Using the nitride films 26, 32 as the mask, the oxide film 30 on the bottom of the openings 28 are dry-etched, or wet-etched by using hydrofluoric acid compound solution, and the silicon substrate 22 is exposed in the area. Then, as shown in FIG. 2 (e), (f), part of the substrate surface is covered with photoresists 32, 34, and the silicon substrate with exposed openings 28 is etched by RIE. At this time, the depth of etching of silicon substrate 22 is determined by reversely calculating from the desired side etching extend in the later process. That is, it is because the side etching extend is proportional to the size of the silicon surfaces 36, 38 exposed to the side wall of the openings 28.

In consequence, as shown in FIG. 2 (g), the substrate 22 is etched in an alkaline aqueous solution, for example, potassium hydroxide (KOH), ethylenediamine pyrocatechol, or hydrazine pyrocatechol, and openings 40 are formed. The bottom and side wall of the openings 40 have a plane orientation of {100}, and the KOH solution has the etching speed faster by about two digits on the {100} plane of silicon substrate, than that on the {111} plane, so that the openings 40 are formed with a property of orientation-dependent etching. Meanwhile, the etching in the lateral direction of the side wall stops when the {111} plane intersects at 109.5°, and side etching in the upward direction does not occur. The depth of etching in the lateral direction is, supposing the depth of the exposed side walls 36, 38 to be 1, about 0.35. Then, as shown in FIG. 2 (*h*), the silicon nitride films 26, 32 are used as the mask for oxidation, and an oxide film is formed in the openings 40. At this time, by the width of active region, etching extent in the lateral direction and proper oxidation time, the oxide films 42 extending in the lateral direction of the openings 40 will be mutually connected in the lower part of the active region 44. Consequently, by the usual groove filling method, polycrystalline silicon films 48 are buried into the openings 28, and an oxide film 50 is formed on the polycrystalline silicon films by using the silicon nitride films 26, 32 as the mask as shown in FIG. 2 (*i*).

Figure 2A:
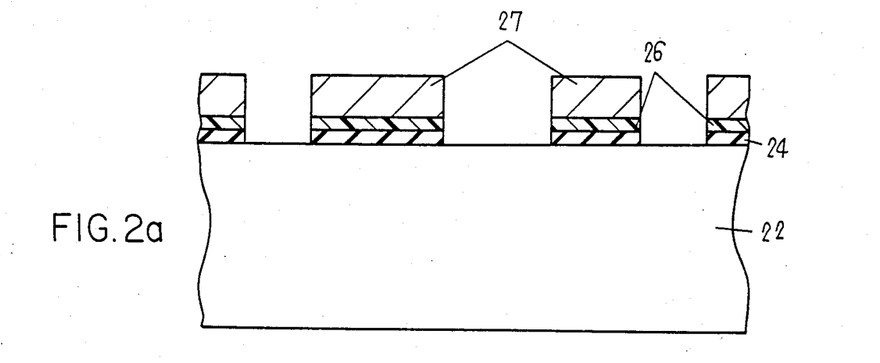
Figure 2B:
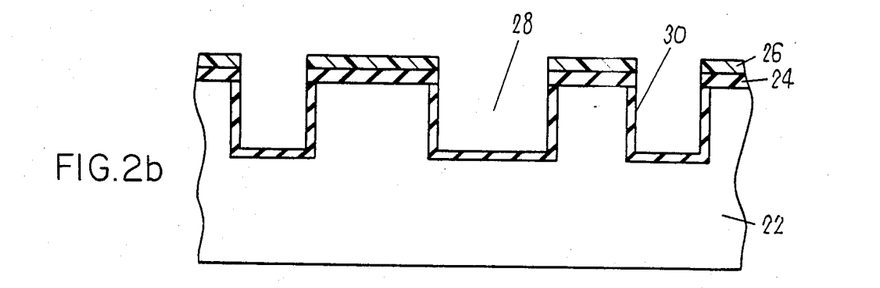
Figure 2C:
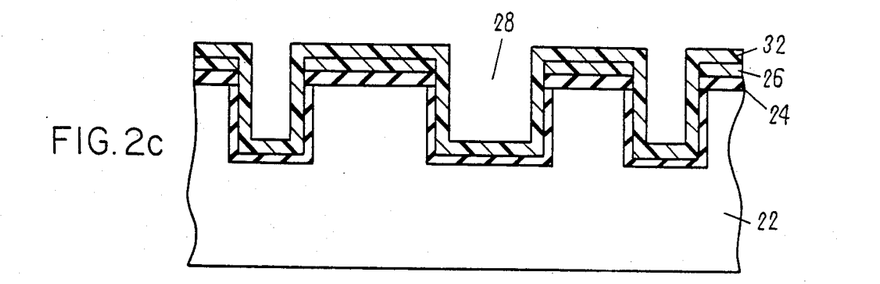
Figure 2D:
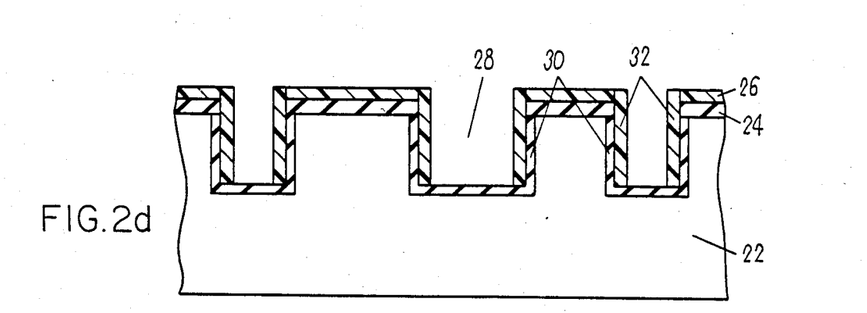
Figure 2E:
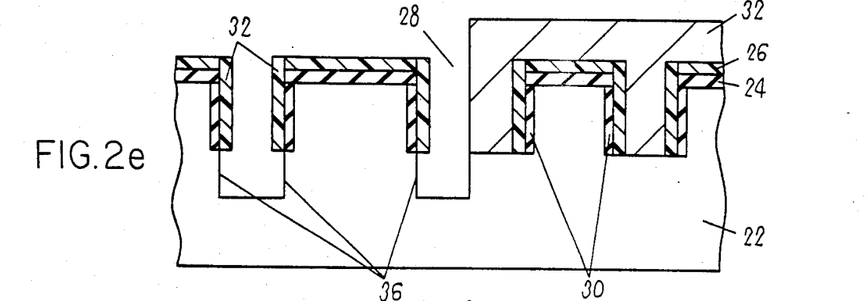
Figure 2F:
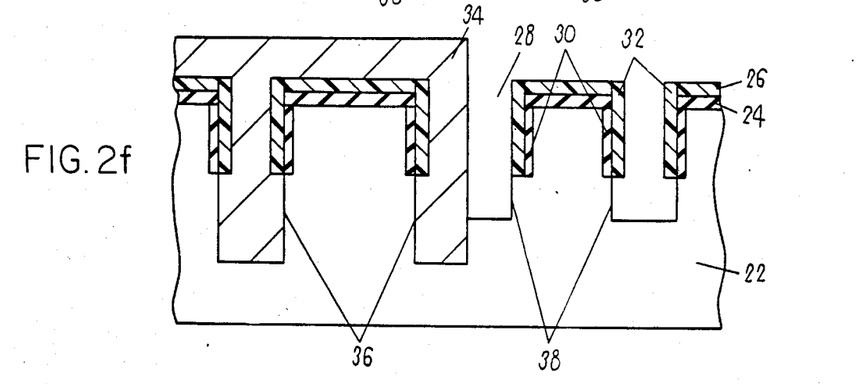
Figure 2G:
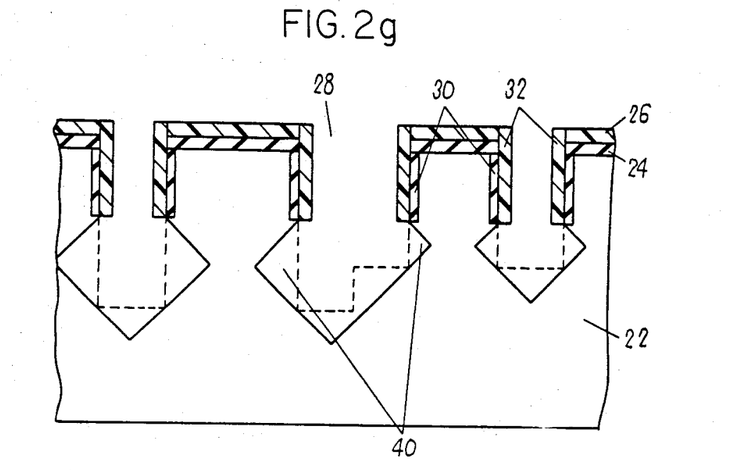
Figure 2H:
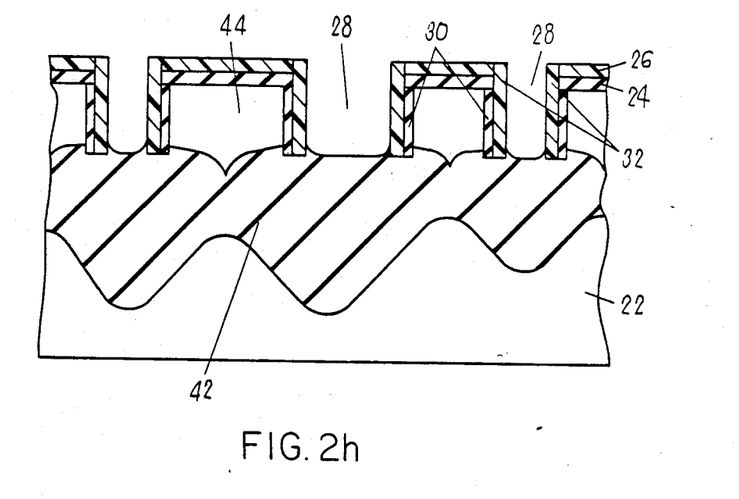
Figure 2I:
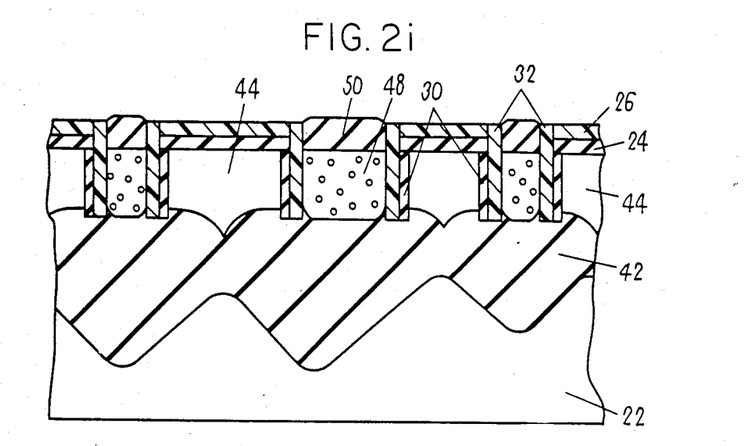
Figure 2J:
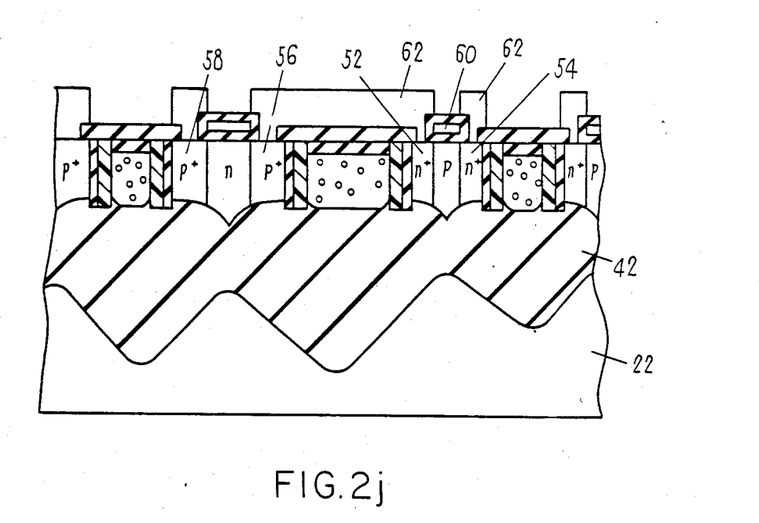

In this process, the structure of active region 44 being enclosed with oxide film is obtained. Meanwhile, since the openings 40 are formed by orientation-dependent etching of part of the substrate in the lower part of the active region 44, the controllability of etching extent is extremely high, and the amount of oxidation in the lateral direction required to connect the separate oxide films in the bottom of active region is small, and strains accompanying swelling of oxide parts are few, and the volume reduction of the active region is also small.

FIG. 2 (*j*) shows an example of CMOS integrated circuit formed in thus isolated active regions 44. Numerals 52, 54 are drain and source regions of n-channel MOS transistor, 56, 58 are drain and source regions of p-channel MOS transistor, 60 is a gate electrode, and 62 is an Al wiring. Since each transistor is enclosed with oxide film, there is no parasitic transistor which may cause latchup, and latchup does not occur. At the same time, since the PN junction area is small, the resistance to alpha-rays is improved. Besides, needless to say, since this integrated circuit has the periphery of its diffusion layer covered with a thick oxide film, the parasitic capacitance is small, and the conditions of integrated circuit of high speed and low power consumption are fulfilled.

[Embodiment 2]

FIG. 3 is a process sectional drawing showing a second embodiment of this invention. In FIG. 3 (*a*), numeral 64 is a silicon board of which crystal plane orientation is {100}. The parts to be isolated regions in the substrate are selectively etched, and openings 66 are formed. The etching method is the reactive ion etching with a strong anisotropic property, and the openings 66 are etched vertically. After forming a thermal oxidation film 68 over the entire surface, an oxidation resistant film, for example, a silicon nitride film 70, is applied by vacuum desposition process. Since the vacuum deposition is excellent in linearity, nitride film does not deposit on the side wall with greater depth than specified of the openings 66. A similar shape may be obtained also by using an oblique beam deposition process with excellent linearity. Using the silicon nitride film 70 as the mask, the oxide film 68 is etched, and the silicon substrate of the bottom and side wall of the openings 66 is exposed. See FIG. 3 (*b*).

Conforming then to the procedure of embodiment 1, as shown in FIG. 3 (*c*), the substrate is processed by orientation-dependent etching is alkaline aqueous solution, and openings 72 are formed. Then, as shown in FIG. 3 (*d*), oxidation is effected, and oxide films 72 are formed at the openings 72, and connected beneath the active region 76. By the usual groove filling method, the openings 66 are filled with polycrystalline silicon film 78, and an oxide film 80 is formed on the polycrystalline silicon film. See FIG. 3 (*e*).

Figure 3A:
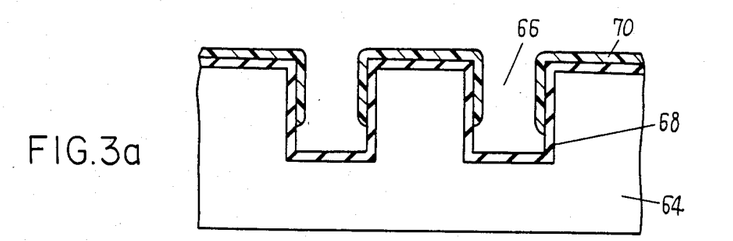
Figure 3B:
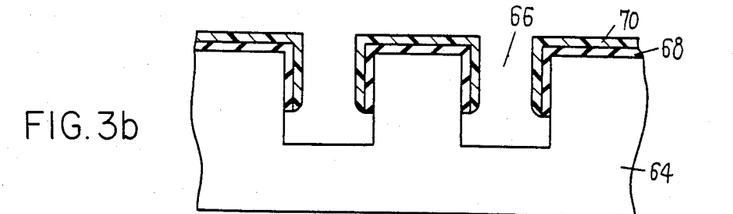
Figure 3C:
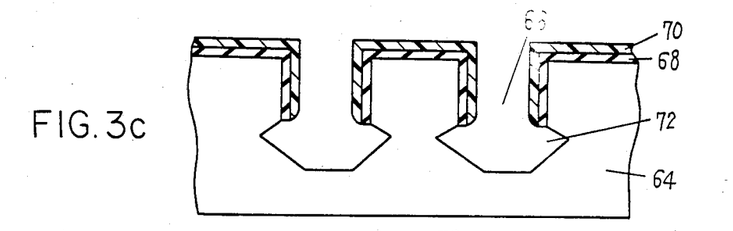
Figure 3D:
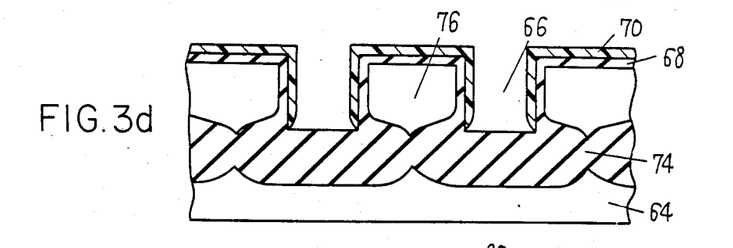
Figure 3E:
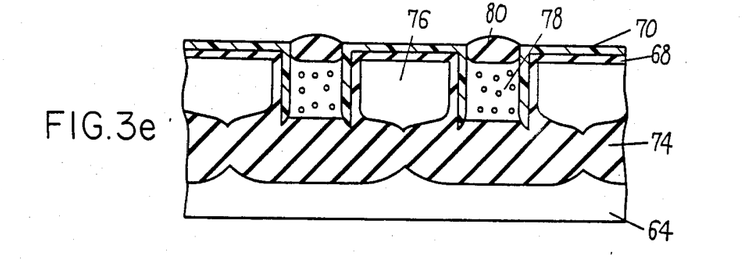

In this process, the structure of active region 76 enclosed with oxide film is obtained.

[Embodiment 3]

FIG. 4 shows a process sectional drawing of a third embodiment of this invention. In FIG. 4 (*a*), numeral 82 is a silicon substrate with plane orientation of {100}, 84 is a thermal oxidation film, 86 is a silicon nitride film, and 88 is a CVD oxide film. By selectively opening only the parts to become isolated regions, the substrate is anisotropically etched by RIE to form vertical openings 90. Then, using the silicon nitride film 86 as the mask, a thermal oxidation film 92 is formed in the openings 90, and silicon nitride film 94 and CVD oxide film 96 are formed on the side wall of the openings as described in embodiment 1 as shown in FIG. 4 (*b*). The substrate 82 exposed in the bottom of the openings is anisotropically etched by RIE, and openings 98 are formed as shown in FIG. 4 (*c*). Next, a silicon nitride film 100 is formed on the entire surface by low pressure CVD as shown in FIG. 4 (*d*). By anisotropic etching by RIE, the silicon nitridre film is removed from the bottom of the openings, leaving the silicon nitride film 100 only on the side wall of the openings. See FIG. 4 (*e*)

In consequence, using the silicon nitride film 100 as the mask, the thermal oxidation film 102 is formed in the bottom of the openings as shown in FIG. 4 (*f*). When the silicon nitride film 100 is removed, the substrate is exposed at side wall of the openings 98 as shown in FIG. 4 (*g*). Then using the oxide films 96, 102 as the mask, the substrate is processed by orientation-dependent etching in an alkaline aqueous solution, and openings 104 are formed as shown in FIG. 4 (*h*). Then, by oxidation using silicon nitride films 86, 94 as the mask, oxide films 106 are formed in the openings 104 are connected in the lower part of the active region 108 as shown in FIG. 4 (*i*). Thereafter, by the usual groove filling method, the openings 98 are filled with polycrystalline silicon film 110, and an oxide film 112 is formed on-the-polycrystalline silicon film 110. See FIG. 4 (*j*).

Figure 4A:
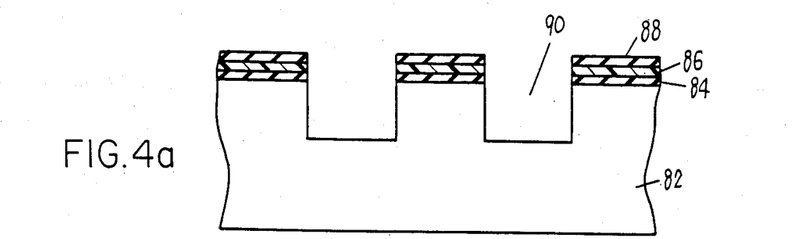
Figure 4B:
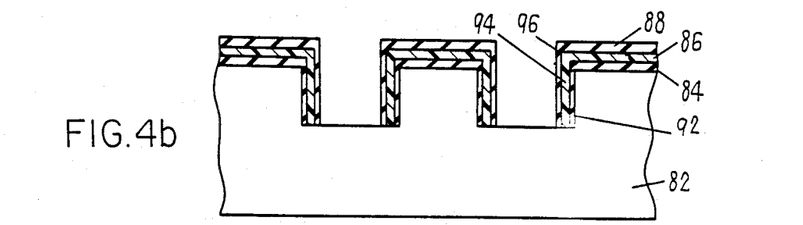
Figure 4C:
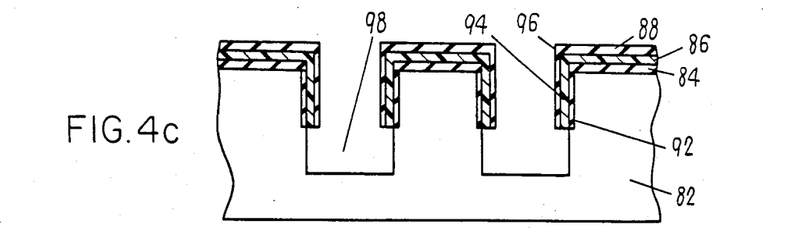
Figure 4D:
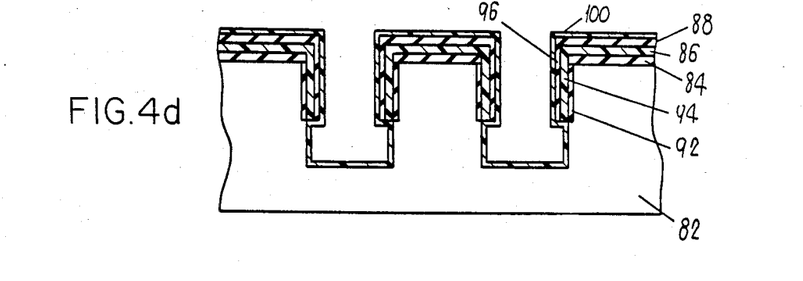
Figure 4E:
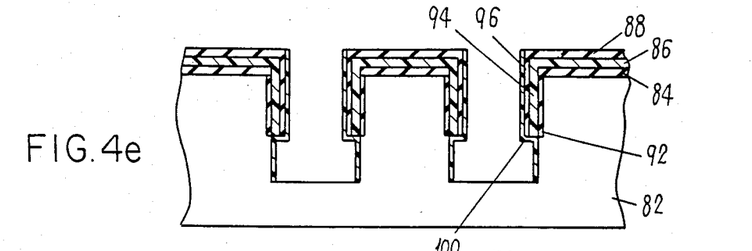
Figure 4F:
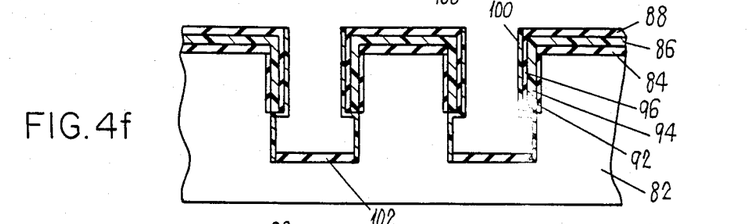
Figure 4G:
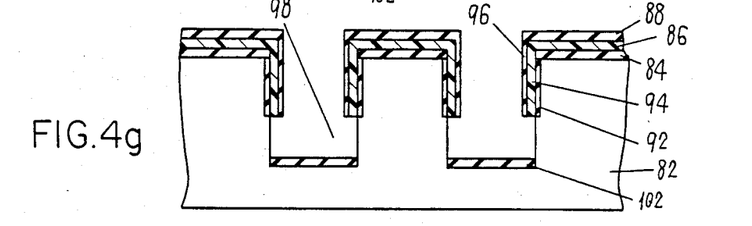
Figure 4H:
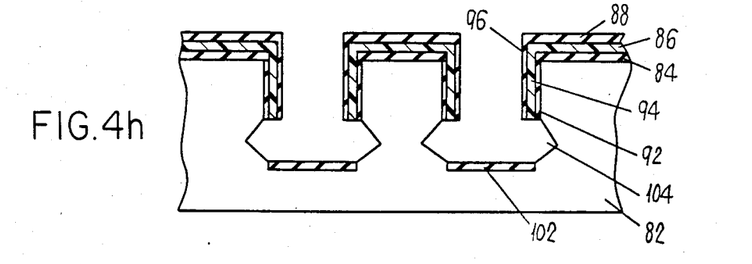
Figure 4I:
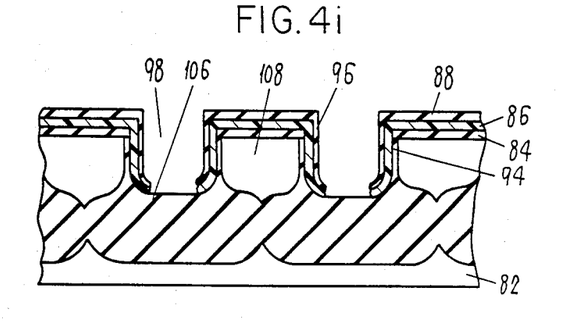
Figure 4J:
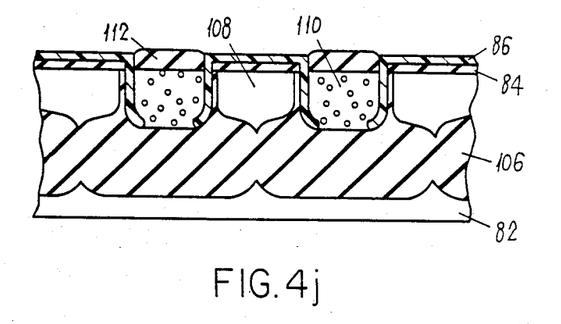

Thus, the structure of active region 108 enclosed with oxide film is obtained.

In this embodiment, since oxide films 102 are formed in the bottom of the openings 98, only the side wall of the substrate openings is etched, and the etchings advanced until mutual {111} planes intersect with each other, and hardly move ahead thereafter, so that the controllability is excellent. On the other hand, the etching extend in the lateral direction is determined by the distance of the substrate exposed to the side wall of the openings 98, and it is about 0.35 times this distance. In addition, since etching is not done downward in the openings 98, the depth of the openings 98 after formation of the oxide film 106 may be smaller, so that the openings 98 may be easily filled up with polycrystalline silicon film.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention

What is claimed is:

1. A method of manufacturing a semiconductor device comprising:

forming a plurality of first openings in a surface of a semiconductor substrate, the crystal plane orientation of said semiconductor substrate being {100};

forming an oxidation resistant film on said surface of said semiconductor substrate and on part of the side walls of the first openings;

forming an etching resistant film on the bottom of said first openings;

exposing said semiconductor substrate at the side walls of said first openings by removing said oxidation resistant film on said part of said side walls;

forming second openings by orientation-dependent etching of the portion of said semiconductor substrate exposed at the side walls of said first openings;

forming oxide films in said second openings using said oxidation resistant film as a mask so that said oxide films are buried into adjacent second openings and are connected to each other to define active regions of said semiconductor device; and filling the first openings with an insulator material.

2. The method of manufacturing semiconductor device as set forth in claim 1, wherein the second openings are formed by etching using an etchant having its fastest etching speed on the plane of the semiconductor substrate with orientation of {100}.

3. The method of manufacturing semiconductor device as set forth in claim 2, wherein the etchant is potassium hydroxide, mixed solution of ethylenediamine and pyrocatechol, mixed solution of hydrazine and pyrocatechol, or their aqueous solution or mixed solution.

4. A method of manufacturing semiconductor device comprising:

forming a plurality of first opening in a surface of a semiconductor substrate of which the crystal plane orientation is {100};

forming an oxidation resistant film on said surface of said semiconductor substrate and surfaces of said first openings including bottom surfaces thereof;

exposing said semiconductor substrate at the bottom surfaces of said first openings by removing said oxidation resistant film at said bottom surfaces;

forming plural second openings, differing in size from each other, by orientation-dependent etching of the portion of said semiconductor substrate exposed at said first openings;

forming oxide films in said second openings using said oxidation resistant film as a mask so that the oxide films are buried in the adjoining second openings and are connected with each other; and filling said first openings with an insulator material.

5. The method of manufacturing semiconductor device as set forth in claim 4, wherein said second openings are formed by etching using an etchant having its fastest etching speed on the plane of semiconductor substrate with orientation of {100}.

6. The method of manufacturing a semiconductor device as set forth in claim 4, wherein said first openings are formed with different depths in respective parts of the bottoms thereof in order to form second openings differing in size from each other for the orientation-dependent etching of said semiconductor substrate exposed to said first openings.

* * * * *